United States Patent
Chang et al.

(10) Patent No.: US 7,299,441 B2
(45) Date of Patent: Nov. 20, 2007

(54) METHOD FOR IMPROVING EFFICIENCY IN LAYING OUT ELECTRONIC COMPONENTS

(75) Inventors: Vam Chang, Taipei (TW); Ming-Hui Lin, Taipei (TW)

(73) Assignee: Inventec Corporation (TW)

( * ) Notice: Subject to any disclaimer, the term of this patent is extended or adjusted under 35 U.S.C. 154(b) by 309 days.

(21) Appl. No.: 11/088,321

(22) Filed: Mar. 23, 2005

(65) Prior Publication Data

US 2006/0236285 A1 Oct. 19, 2006

(51) Int. Cl.
*G06F 17/50* (2006.01)
(52) U.S. Cl. .................. 716/11; 716/3; 716/15
(58) Field of Classification Search ........... 716/3, 716/7–15, 18; 345/619; 382/113
See application file for complete search history.

(56) References Cited

U.S. PATENT DOCUMENTS

| | | | |
|---|---|---|---|
| 5,187,784 A | * | 2/1993 | Rowson .................. 716/7 |
| 5,901,066 A | * | 5/1999 | Hong ...................... 716/8 |
| 2002/0018583 A1 | * | 2/2002 | Gont et al. ............... 382/113 |
| 2004/0143803 A1 | * | 7/2004 | Cowan et al. ............ 716/4 |
| 2006/0098026 A1 | * | 5/2006 | Benayoun et al. ........ 345/619 |
| 2006/0156268 A1 | * | 7/2006 | Wen et al. ................ 716/18 |

* cited by examiner

*Primary Examiner*—Paul Dinh
(74) *Attorney, Agent, or Firm*—Peter F. Corless; Steven M. Jensen; Edwards Angell Palmer & Dodge LLP

(57) ABSTRACT

A method is proposed for improving the layout efficiency in laying out electronic components, which is applicable to information processing equipment, to accelerate the layout of electronic components. First, a first two-dimensional plan view including various electronic component members is preset using a drafting software platform. Subsequently, the two-dimensional plan view is converted to a text file and all the relevant data of the electronic components contained in the two-dimensional plan view are encoded in the text file. Then, all of the electronic component members contained in the first two-dimensional plan view are displayed in a second two-dimensional plan view, and a function selection menu is generated by an arithmetic process. Therewith, a user is able to select the data of the electronic component contained in the text file via the function selection menu to perform the layout operations for a printed circuit board.

6 Claims, 6 Drawing Sheets

METHOD FOR IMPROVING EFFICIENCY IN LAYING OUT ELECTRONIC COMPONENTS

FIELD OF THE INVENTION

The present invention relates to a technique of laying out electronic components, and more particularly, to a method for improving efficiency in laying out electronic components which facilitates a user to select a desired electronic component number, so as to improve speed of laying out an electronic circuit.

BACKGROUND OF THE INVENTION

With a booming development of electrical technology, electronic products, such as mobile phone, digital camera, computers, and MP3 player have become popular in every family. However, a fabrication of printed circuit boards (PCBs) for the electronic products, which fabrication involves designing, circuit drafting, mechanical drafting, component placement, and drafting of a layout diagram for the printed circuit board, before fabrication of electronic products, is time-consuming. Accordingly, manufacturers continue to propose new techniques in hope of simplify the process of researching for the electronic products.

Generally, the printed circuit board is accomplished with a co-operation of an electronic engineer, a mechanical engineer, and a layout engineer. FIG. 1 is a flowchart showing the design process for a printed circuit board as practiced in the prior-art. Firstly, in Step 101, a circuit diagram for an electronic product is designed by the electronic engineer and converted to an initial layout diagram. Secondly, in Step 103, a mechanical diagram for the electronic product is designed and drafted by the mechanical engineer. Thirdly, in Step 105, component placement is performed by the electronic engineer and the layout engineer, such that the electronic components are placed on the circuit board. Last, in Step 107, the electronic components placed on the circuit board are interconnected by a routing method so as to complete the design of the layout diagram. Finally, in Step 109, the printed circuit board is fabricated by a manufacturer according to the layout diagram of the circuit board.

For the foregoing Steps 101 through 107, the designers design the printed circuit board for an electronic product by using drafting software installed in a computer. When the drafting software is employed to design the circuit diagram of an electronic product by an electronic engineer, a circuit diagram file is firstly converted to a layout diagram file and the placement of the electronic components is performed. FIG. 2 is a flowchart showing the placement procedure for electronic components of a prior-art printed circuit board design technique.

Referring to FIG. 2, in Step 201, the circuit diagram for an electronic product is designed by an engineer using the drafting software, and the circuit diagram file for the product being drafted is subsequently converted to the layout diagram file. In Step 203, rules for printed circuit board layout, to be stored in the layout diagram file, are set up by an engineer using the drafting software. Such rules would constrain the printed circuit board layout in certain ways based on certain design requirements. Then, in Step 205, electronic components and relevant connection circuitry contained in the drafted circuit diagram are added into the layout diagram file for the printed circuit board. In Step 207, important components determined in the mechanical diagram are initially placed on the circuit board. Finally, in Step 209, other electronic components which belong to the same page or area of the circuit diagram are located one by one in a manual manner and added to the layout plan for the printed circuit board. Afterwards, determination is made as to whether the external connection locations are congruent with the heights and positions of openings shown in the mechanical diagram in a one-by-one fashion until all of the electronic components have been placed onto the circuit board.

During the placement procedure for the electronic components, however, engineers often need to search through the electronic components which belong to the same page of the circuit diagram, sometimes containing thousands of electronic components, to locate the circuit at hand. Such searching, in order to place the electronic components one-by-one into the printed circuit board layout, can be very time-consuming and placement errors can occur. Moreover, as the variety of electronic components has gradually increased and components have become extremely similar, if the designer decides to modify or replace an electronic component of the original circuit diagram, it is hard to immediately locate the electronic component from numerous pages of the circuit diagram, so as to slow down the design process.

Accordingly, prior-art layout methods for electronic component layout are not optimized, particularly for electronic products with a short design cycle. The problem to be solved here, therefore, is to provide a method for improving layout efficiency for electronic components in the overall design process, so as to decrease both initial design and subsequent modification time required for electronic component placement. In the latter case, the goal would be to allow the electronic engineer to immediately search and locate electronic components to be modified or replaced, so as to accelerate the design process.

SUMMARY OF THE INVENTION

In light of the above prior-art drawbacks, an objective of the present invention is to provide a method for improving efficiency in laying out electronic components, whereby the electronic components contained in a circuit diagram can be rapidly and precisely placed in a printed circuit board.

Another objective of the present invention is to provide a method for improving efficiency in laying out electronic components, so that subsequent placement of the electronic components in a printed circuit board no longer requires modifications to electronic circuits, so as to effectively shorten the research time.

In accordance with the above and other objectives, the present invention proposes a method for improving efficiency in laying out electronic components, applicable to the layout operation for the electronic components of a printed circuit board. Initially, a first two-dimensional planar view containing the various electronic components numbers therein is preset using a drafting software platform. Subsequently, the two-dimensional planar view is converted into a text file and all the data contained in the two-dimensional planar view are recorded in the text file. Then, all of the electronic component numbers contained in the first two-dimensional planar view are displayed in a second two-dimensional planar view, and a function selection menu is generated by an arithmetic process, such that a user can select electronic component numbers contained in the text file to perform placement of the electronic components.

Using the method proposed in the present invention, the placement of the electronic components can be rapidly and precisely performed by an electronic engineer and a layout engineer so as to increase layout speed for electronic components and accelerate the design process. Furthermore, when the electronic engineer decides to modify the circuit or replace an electronic component, according to the method proposed in the present invention, the desired electronic component to be modified or replaced can be immediately located, so as to simplify the procedure required for changing electronic component layout.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described in the following with specific embodiments, so that one skilled in the pertinent art can easily understand other advantages and effects of the present invention from the disclosure of the invention.

Figure 1:
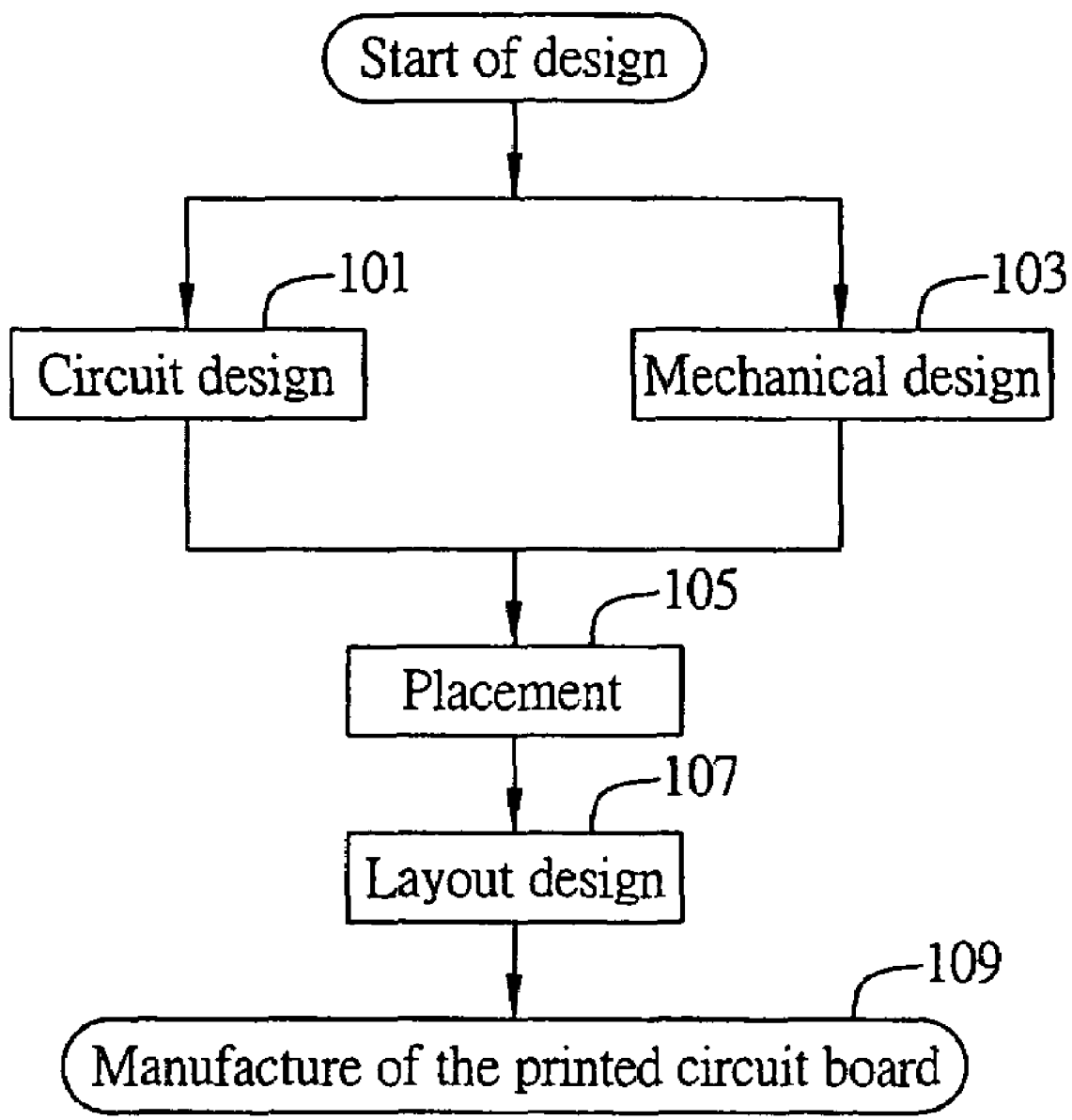
FIG. 1 is a flowchart showing a process of designing a printed circuit board for a currently available electronic product.
Figure 2:
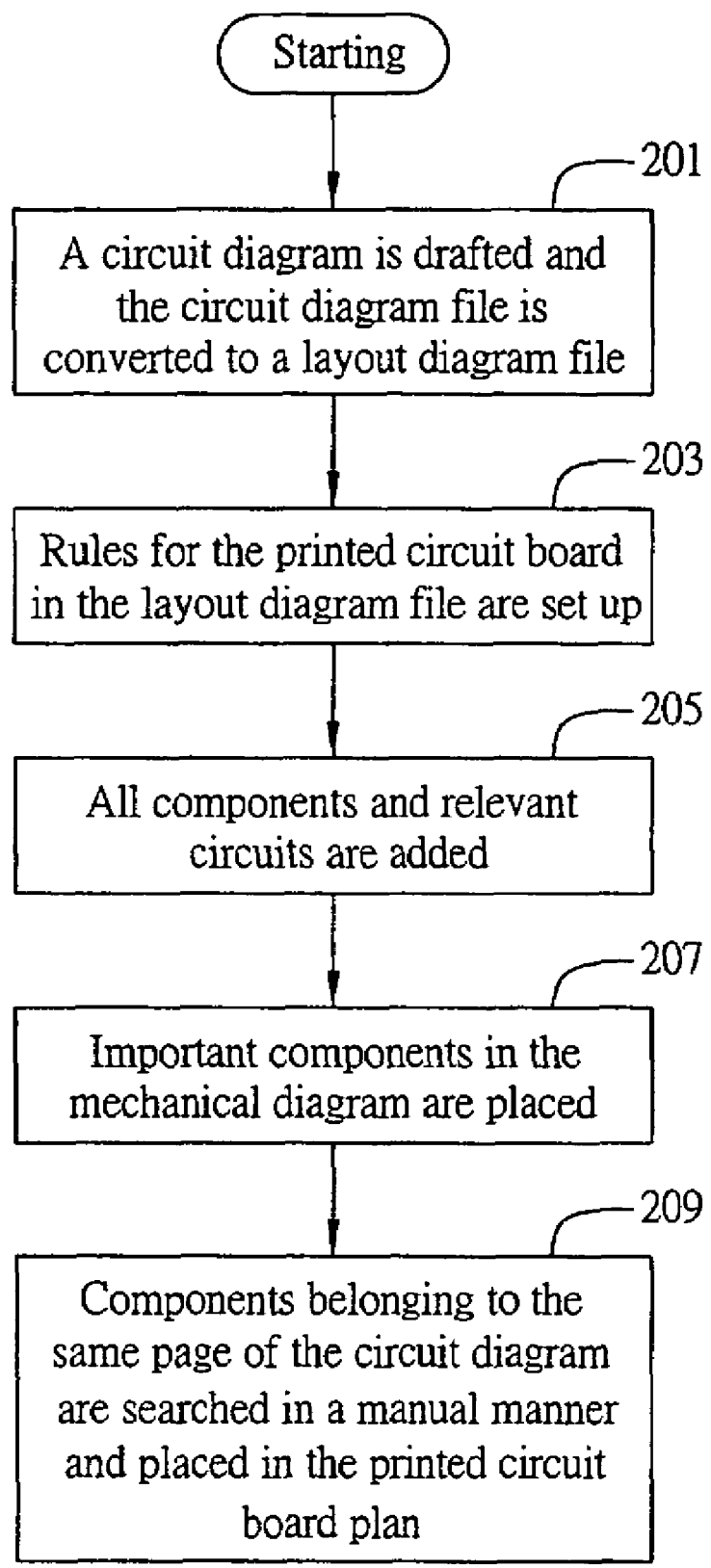
FIG. 2 is a flowchart showing a placement of electronic components in a conventional printed circuit board.
Figure 3:
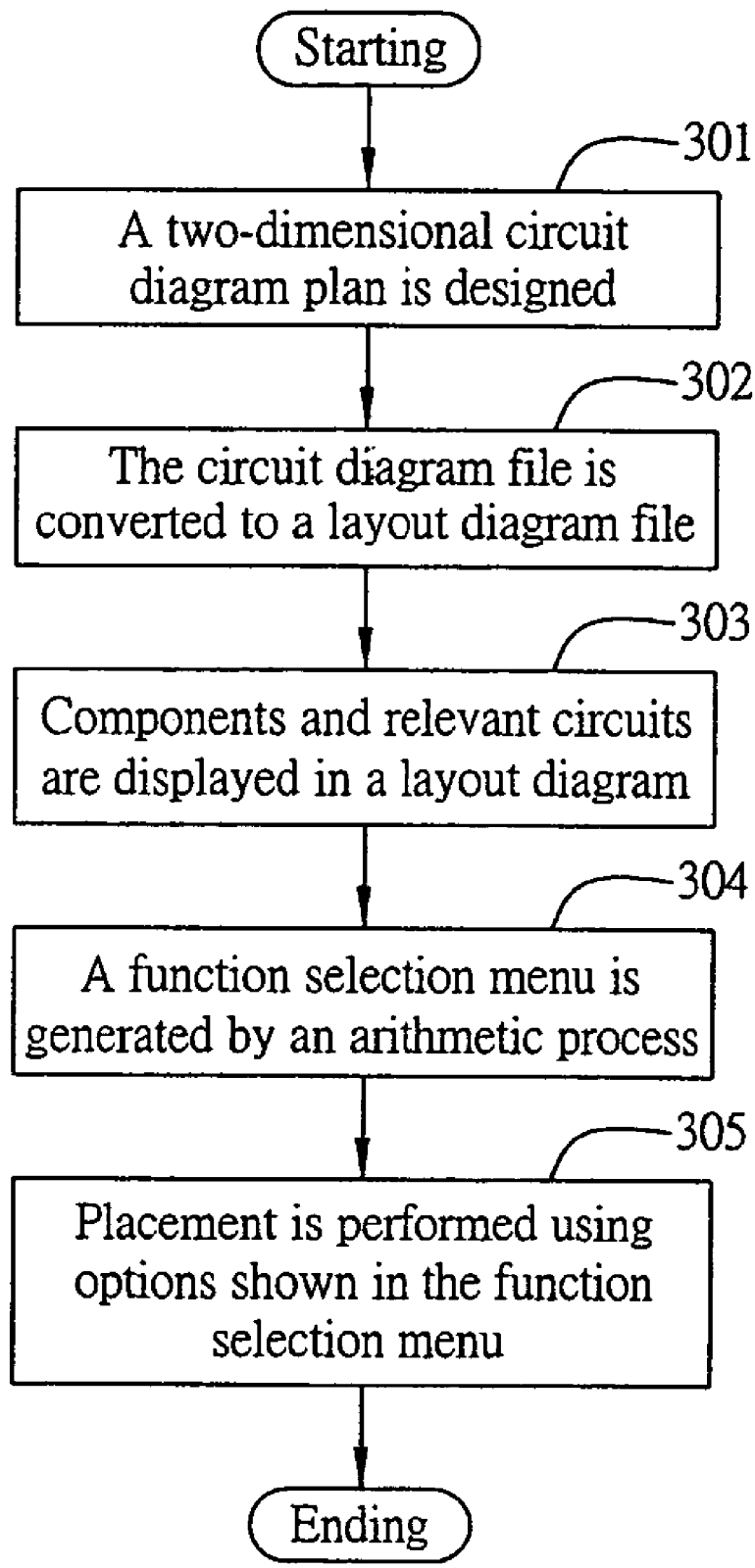
FIG. 3 is a flowchart showing a method for improving efficiency in laying out electronic components according to the present invention.

FIG. 3 is a flowchart showing a method for improving efficiency in laying out electronic components according to the present invention. In the present embodiment, the method proposed in the present invention is applied to the layout operation for electronic components via a Mentor drafting software platform (hereinafter known as the drafting software platform) included in an information processing system. Thus, when designing an electronic product, a circuit designer is able to successfully design and layout a printed circuit board for the electronic product using the method disclosed in the present invention. As shown in the diagram, in Step 301, a two-dimensional circuit diagram plan for the electronic product is designed by an electronic engineer using the drafting software platform, and the circuit diagram has a plurality of electronic component members. Subsequently, Step 302 is performed.

In Step 302, the circuit diagram file is converted into a text file. The text file is encoded with the various electronic component numbers contained in the circuit diagram shown in Step 301. The data is stored in a text format, such that a user is able to acquire the data of the circuit diagram being previously drafted via the text file. Next, Step 303 is performed.

In Step 303, the electronic components and relevant layout circuitry comprised in the two-dimensional circuit diagram plan designed in Step 301 are displayed in a layout diagram for the printed circuit board prior to performance of Step 304, such that placement of the electronic components can be performed by a layout engineer.

In Step 304, a function selection menu is generated via an arithmetic process, so that the electronic engineer is able to select the electronic component numbers contained in the text file using the function selection menu and perform placement of the electronic components prior to performing Step 305.

In Step 305, the electronic components are placed in the printed circuit board by selecting options shown in the function selection menu by the electronic engineer prior to performance of routing by the layout engineer.

Figure 4:
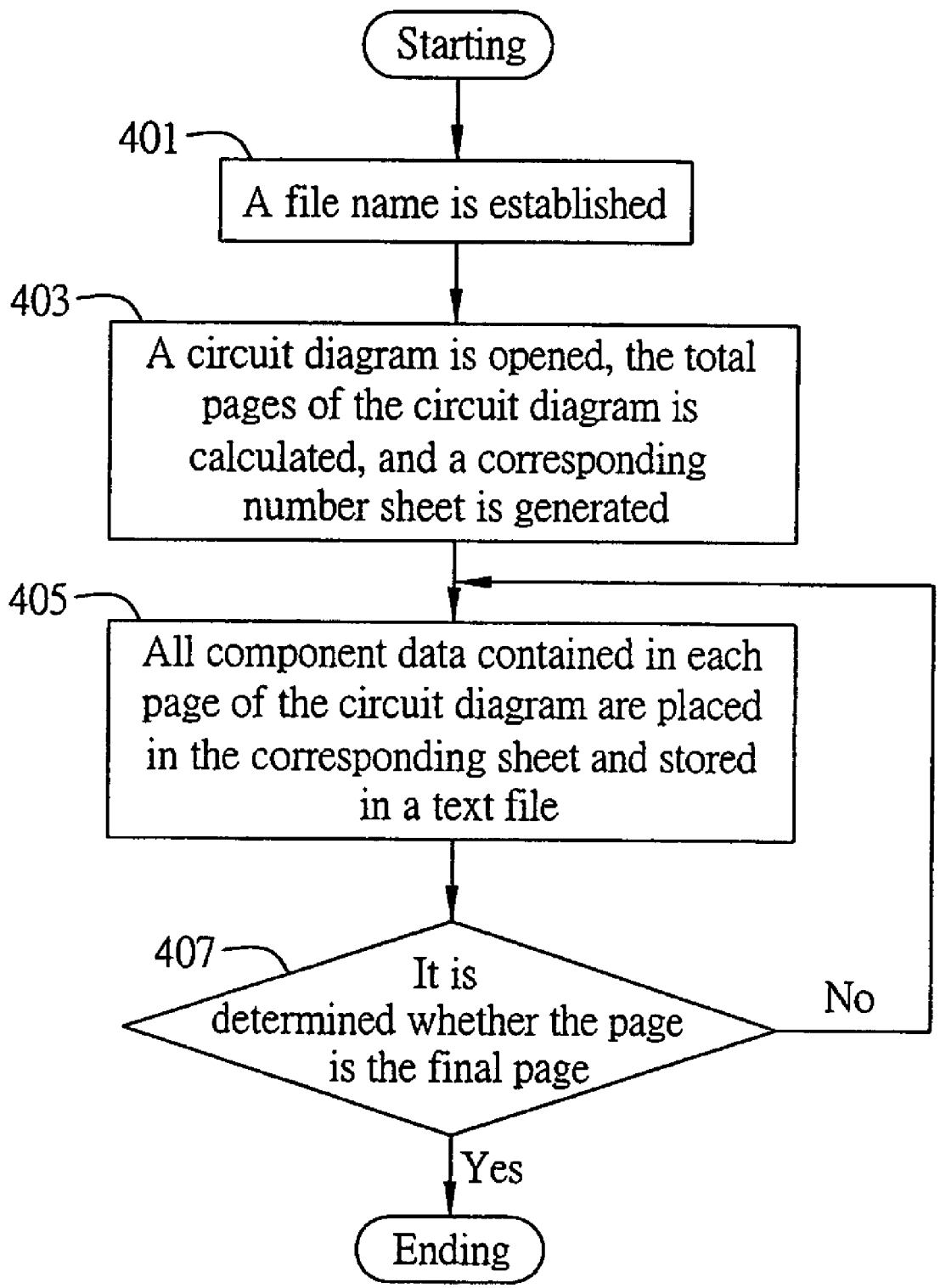
FIG. 4 is a flowchart showing a conversion of a circuit diagram file into a text file.

FIG. 4 is a flowchart showing the conversion of a circuit diagram file into a text file. Electronic component names and lists comprised in the circuit diagram are converted and stored in a text format. As shown in the diagram, in Step 401, a file name for the text file, such as pcb-ba-ref, is established prior to performance of Step 403.

In Step 403, the drafted two-dimensional circuit diagram plan is opened. Also, the total page numbers for the circuit diagram is calculated and a corresponding page number sheet is generated prior to performance of Step 405.

In Step 405, electronic component members contained in the current page being processed for the circuit diagram are stored in the corresponding sheet prior to performance of Step 407.

In Step 407, it is determined as whether the page is the final page. If the result is affirmative, the process ends, whereas if the result is negative, Step 405 is performed.

Figure 5:
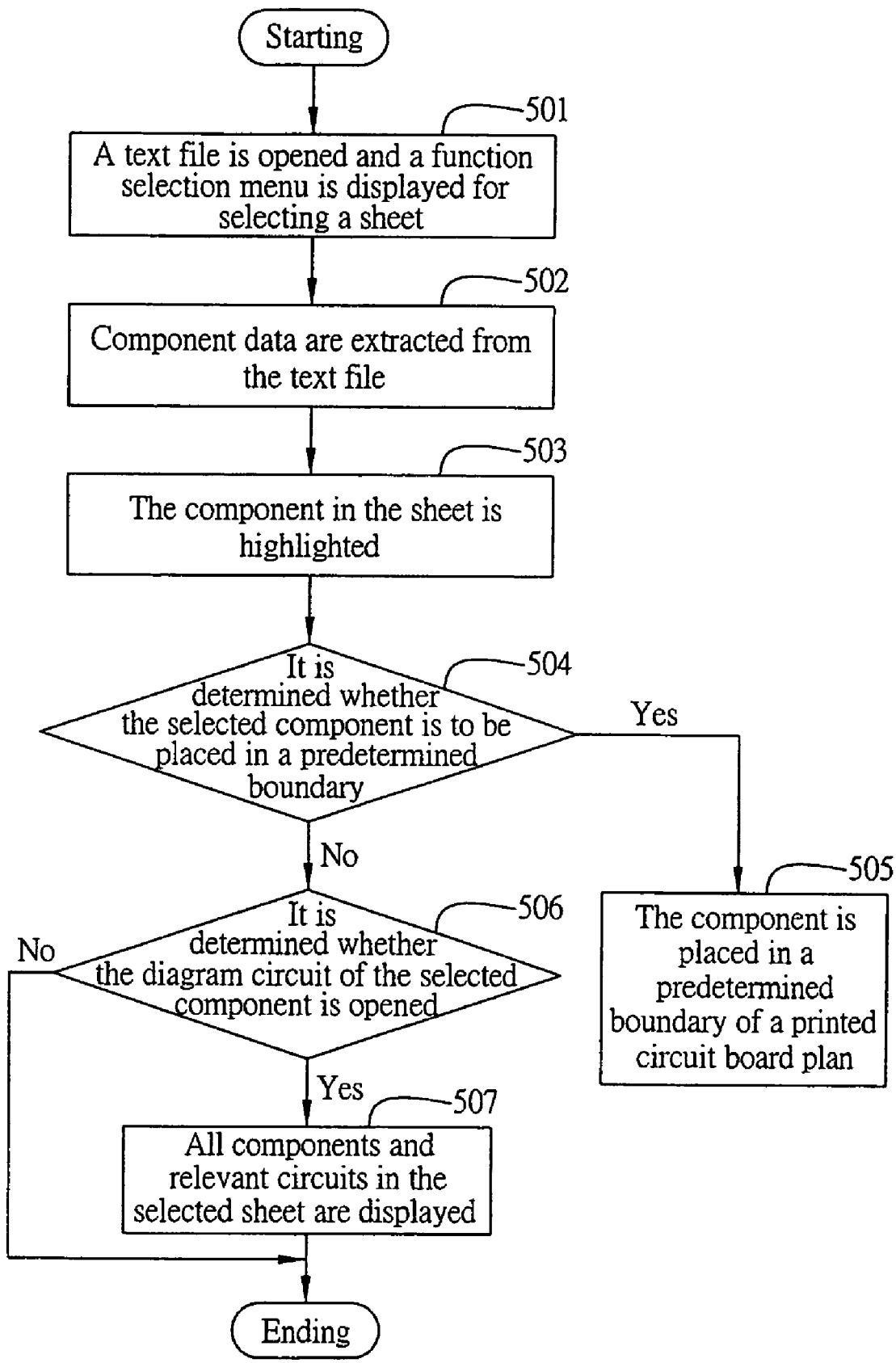
FIG. 5 is a flowchart showing the detailed process for Step 304.

FIG. 5 is a flowchart showing the detailed process for Step 304 to illustrate placement of all electronic components in each list. The step comprises the following sub-steps:

First of all, in Step 501, a text file is initially opened and a function selection menu is displayed, such that a user is able to select a list for performing placement, prior to performing Step 502.

In Step 502, electronic component numbers recorded in the text file are extracted, prior to performing Step 503.

In Step 503, an electronic component number in the list is selected by the user and highlighted, prior to performing Step 504.

In Step 504, it is determined whether the selected electronic component number is to be placed in the printed circuit board selected by the user. If so, Step 505 is performed, otherwise, Step 506 is performed.

In Step 505, the electronic component selected by the user is placed in a predetermined location on the printed circuit board, prior to performing Step 506.

In Step 506, it is determined as whether the circuit diagram for the electronic component in the sheet selected by the user is opened. If it is opened, Step 507 is performed to display all components and relevant circuits contained in the selected sheet, and then the process terminates, otherwise, the process terminates immediately.

Figure 6:
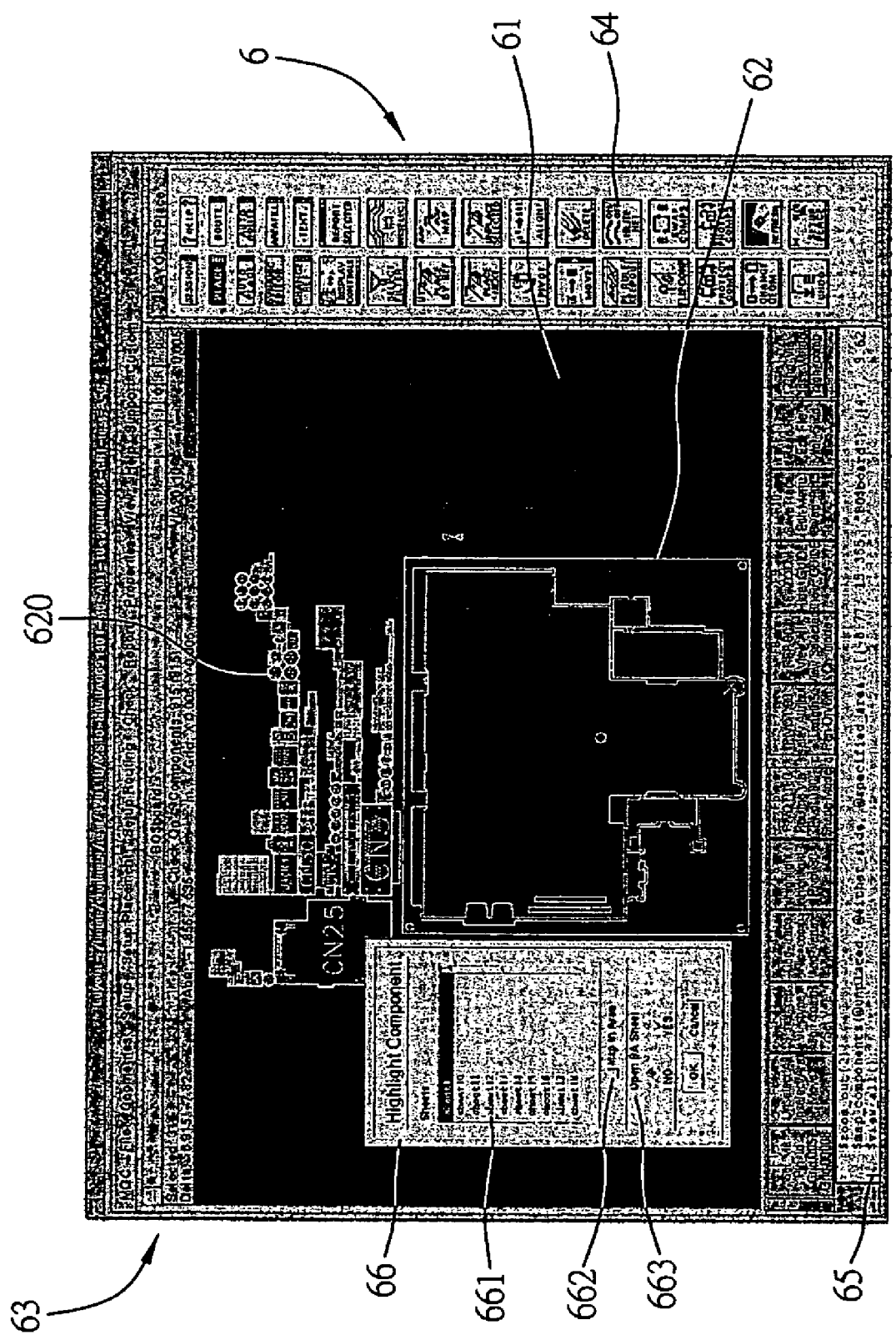
FIG. 6 is an operation interface for drafting software that employs the method according to the present invention.

FIG. 6 is an operating interface 6 for drafting software that employs the method according to the present invention. As shown in the diagram, a user applies the method for laying out electronic components according to the present invention via the operating interface 6 embedded in drafting software such as the Mentor drafting software. The operating interface 6 at least comprises a two-dimensional planar view 61, a layout planar view 62 for a printed circuit board, a text command block 63, a diagram command block 64, a message block 65, and a function selection menu 66. The operating interface 6 is known in the prior-art and thus will not be further described.

The function selection menu 66 is generated in the operating interface 6 via an arithmetic process. The function selection menu further comprises a list page number selection table 661, which allows the user to select electronic component figures, and relevant circuits 620 contained in the list page number to be opened; a placement selection 662 for placing an electronic component and relevant circuitry contained in the selected sheet in a boundary selected by the user via a specific arrangement method; and a circuit diagram selection 663 for opening an unconverted circuit diagram (not shown) for the selected list in the two-dimensional planar view.

Accordingly, the method for improving efficiency in laying out electronic components proposed in the present invention can be applied to the design procedure for laying out a printed circuit board, such that time required to place electronic components can be decreased and placement accuracy can be improved. Furthermore, when the user wants to modify the original circuit diagram or replace an electronic component in the circuit diagram, the desired electronic components can be immediately located for modification or replacement, so as to avoid inconvenience in the modification or replacement of electronic components.

It should be apparent to those skilled in the art that the above description is only illustrative of specific embodiments and examples of the present invention. The present invention should therefore cover various modifications and variations made to the herein-described structure and operations of the present invention, provided they fall within the scope of the present invention as defined in the following appended claims.

What is claimed is:

1. A method for improving efficiency in laying out electronic components applicable to a layout operation for electronic components in coordination with an information processing equipment, the method comprising steps of:

establishing a first two-dimensional planar view containing various electronic component numbers;

converting the first two-dimensional planar view to a text file, wherein the text file is encoded with all of the electronic component numbers contained in the first two-dimensional planar view;

establishing a second two-dimensional planar view for displaying the electronic component numbers contained in the first two-dimensional planar view; and generating a function selection menu by an arithmetic process, such that the electronic component numbers in the text file can be selected via the function selection menu, wherein the function selection menu further comprises a list page number selection for selecting a page to be opened, a placement selection for placing the electronic components contained in a selected sheet in a predetermined printed circuit board diagram, and a circuit diagram selection for revealing the electronic components and relevant circuits in the circuit diagram.

2. The method of claim 1, wherein the method is established in drafting software.

3. The method of claim 2, wherein the drafting software is Mentor.

4. The method of claim 1, wherein the first two-dimensional planar view is an electronic circuit diagram.

5. The method of claim 1, further comprises steps of:

storing the electronic component numbers of the first two-dimensional planar view in a text format;

establishing the text file;

opening a second two-dimensional circuit diagram plan, calculating the total page numbers of the circuit diagram and generating a corresponding number list; and writing the electronic component numbers contained in each page of the circuit diagram into the corresponding sheet and storing the electronic component numbers in the text file.

6. The method of claim 1, wherein the second two-dimensional planar view is a layout diagram for a printed circuit board.

* * * * *